United States Patent
Zhang

(10) Patent No.: US 10,855,293 B2
(45) Date of Patent: Dec. 1, 2020

(54) COMPUTER READABLE STORAGE MEDIUM, QUICK-START CLOCK SYSTEM AND CONTROL METHOD THEREOF

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/711,406

(22) Filed: Dec. 11, 2019

(65) Prior Publication Data

US 2020/0112315 A1 Apr. 9, 2020

Related U.S. Application Data

(63) Continuation of application No. PCT/CN2018/105818, filed on Sep. 14, 2018.

(51) Int. Cl.
*H03L 7/087* (2006.01)
*H03L 7/099* (2006.01)
*H03L 7/08* (2006.01)

(52) U.S. Cl.
CPC ............ *H03L 7/0992* (2013.01); *H03L 7/087* (2013.01)

(58) Field of Classification Search
CPC .................................................... H03L 7/0992
See application file for complete search history.

(56) References Cited

U.S. PATENT DOCUMENTS 5,923,196 A * 7/1999 Okamoto ............... H03K 3/03
327/147
6,819,195 B1 11/2004 Blanchard
(Continued)

FOREIGN PATENT DOCUMENTS

CN 1237034 A 12/1999
CN 106067762 A 11/2016
(Continued)

OTHER PUBLICATIONS

The Chinese International Search Report, including Written Opinion Report, of corresponding International application No. PCT/CN2018/105818, dated Jun. 12, 2019.

*Primary Examiner* — Hai L Nguyen
(74) *Attorney, Agent, or Firm* — J.C. Patent

(57) ABSTRACT

The present disclosure discloses a quick-start clock system, which includes: a digital subsidiary circuit configured to output a digital control value; a phase-locked loop including a programmable voltage-controlled oscillator circuit and a frequency dividing circuit connected to each other and both connected to the digital subsidiary circuit, the programmable voltage-controlled oscillator circuit obtains the digital control value output, and output a clock signal according to the digital control value, the frequency dividing circuit performs a frequency dividing operation on the clock signal; and a crystal oscillator circuit connected to the phase-locked loop, which includes a crystal and an oscillation injecting circuit connected to the crystal, the oscillation injecting circuit converts the clock signal performed with the frequency dividing operation to a co-frequency fully differential signal, and inject the co-frequency fully differential signal into the crystal.

18 Claims, 5 Drawing Sheets

(56) References Cited

U.S. PATENT DOCUMENTS

| | | | |
|---|---|---|---|
| 8,432,198 B2* | 4/2013 | Liang | H03L 7/23 |
| | | | 327/156 |
| 10,594,325 B2* | 3/2020 | Aboudina | H03L 7/0802 |
| 2003/0231065 A1 | 12/2003 | Ito | |
| 2004/0251979 A1 | 12/2004 | Pan | |

FOREIGN PATENT DOCUMENTS

| | | |
|---|---|---|
| EP | 2884658 A1 | 6/2015 |
| KR | 2011114961 A | 10/2011 |
| WO | WO2016146154 A1 | 9/2016 |

\* cited by examiner

COMPUTER READABLE STORAGE MEDIUM, QUICK-START CLOCK SYSTEM AND CONTROL METHOD THEREOF

CROSS REFERENCE TO RELATED APPLICATIONS

The present application is a continuation of international application No. PCT/CN2018/105818, filed on Sep. 14, 2018, which is hereby incorporated by reference in its entirety.

TECHNICAL FIELD

The present disclosure relates to the field of crystal oscillator technologies and, in particular, to a computer readable storage medium, a quick-start clock system and a control method thereof.

BACKGROUND

Because a series branch of a crystal has a relatively large quality factor Q value, and a ratio of capacitance of a parallel capacitor Cp to capacitance of a series branch Cs is very large, a period for natural oscillation of a crystal oscillator circuit usually takes more than 1000 cycles. In order to accelerate the speed for oscillation of the crystal oscillator, the most direct method is to give the crystal an initial energy, where the larger the initial energy, the faster the speed for oscillation thereof.

In the prior art, to give a crystal an initial energy, a common implementation includes: giving a relatively large step voltage excitation to both ends of the crystal, or continuously injecting energy into the crystal with a relaxation oscillator having a frequency close to a resonance frequency.

However, with respect to the implementation of giving a relatively large step voltage excitation to both ends of a crystal, ultimate effects of this method are restricted due to a limited voltage withstand capability of the transistor itself; with respect to the implementation of injecting with a relaxation oscillator, since the crystal has a very high Q value, which means that a frequency selection bandwidth of a resonant circuit is very narrow, and process, temperature, and power voltage influences will result in a relatively big variation in a center frequency of the relaxation oscillator, thus, ultimate effects of the implementation are greatly reduced; besides, when an injection frequency deviates from the resonance frequency of the crystal, a modulation frequency will be generated for the crystal, and injection efficiency will also be affected.

SUMMARY

The present disclosure provides a computer readable storage medium, a quick-start clock system and a control method thereof, which is applied to solve the problem in the prior art that, injection efficiency is not high and varies severely in a small batch process validation test (PVT) due to a big deviation between a resonant frequency of a frequency injecting oscillator with fast oscillation and that of a crystal.

A first aspect of the present disclosure is intended to provide a quick-start clock system, including:

a digital subsidiary circuit which is configured to output a digital control value;

a phase-locked loop which includes a programmable voltage-controlled oscillator circuit and a frequency dividing circuit, where the programmable voltage-controlled oscillator circuit and the frequency dividing circuit are connected to the digital subsidiary circuit, and the frequency dividing circuit is connected to the programmable voltage-controlled oscillator circuit, the programmable voltage-controlled oscillator circuit is configured to obtain the digital control value output by the digital subsidiary circuit, and output a clock signal according to the digital control value, the frequency dividing circuit is configured to perform a frequency dividing operation on the clock signal output by the programmable voltage-controlled oscillator circuit; and, a crystal oscillator circuit connected to the phase-locked loop, which includes a crystal and an oscillation injecting circuit connected to the crystal, where the oscillation injecting circuit is configured to convert the clock signal performed with the frequency dividing operation to a co-frequency fully differential signal, and inject the co-frequency fully differential signal into the crystal.

In the system as described above, the digital subsidiary circuit includes a digital memory which is connected to a digital control terminal of the programmable voltage-controlled oscillator circuit, the digital control terminal is configured to, when the phase-locked loop starts operating, automatically search a frequency band control word corresponding to a voltage and frequency of the programmable voltage-controlled oscillator circuit.

In the system as described above, the digital subsidiary circuit further includes a digital counter connected to the frequency dividing circuit, and the digital counter is configured to count the number of injection cycles of the injection of co-frequency fully differential signal into the crystal.

In the system as described above, the digital counter is configured with a count control terminal which is configured to control, according to a count control signal received, the digital counter to perform or stop a counting operation.

In the system as described above, the crystal oscillator circuit further includes a negative resistance circuit which is connected to the crystal;

the phase-locked loop further includes a filter circuit and a phase frequency detecting circuit connected to the negative resistance circuit, the phase frequency detecting circuit is connected to the filter circuit and the oscillation injecting circuit.

In the system as described above, the negative resistance circuit is configured with a negative resistance control terminal which is configured to control a connection or disconnection between the negative resistance circuit and the crystal according to a negative resistance control signal received.

In the system as described above, the phase frequency detecting circuit and the filter circuit are respectively provided with a detection control terminal and a filter control terminal, the detection control terminal is configure to control a connection or disconnection of the phase frequency detecting circuit according to a detection control signal received, the filter control terminal is configure to control a connection or disconnection of the filter circuit according to a filter control signal received.

In the system as described above, a voltage control terminal of the programmable voltage-controlled oscillator circuit is connected to a reference voltage circuit which is configured to provide a reference voltage signal for controlling the programmable voltage-controlled oscillator circuit to operate.

In the system as described above, the reference voltage circuit includes a switch which is configured to perform a connection or disconnection operation according to a voltage control signal received.

In the system as described above, the oscillation injecting circuit is configured with an injection control terminal which is configured to control a connection or disconnection between the oscillation injecting circuit and the crystal according to an injection control signal received.

A second aspect of the present disclosure is intended to provide a control method based on the above quick-start clock system, including:

obtaining an injection control signal which is configured to control the oscillation injecting circuit and a negative resistance control signal which is configured to control a negative resistance circuit; and controlling the quick-start clock system according to the injection control signal and the negative resistance control signal.

In the control method as described above, the controlling the quick-start clock system according to the injection control signal and the negative resistance control signal includes:

if the injection control signal is in a preset active state, and the negative resistance control signal is in a preset inactive state, controlling the oscillation injecting circuit to inject a co-frequency fully differential signal into the crystal; or if the injection control signal is in a preset inactive state, and the negative resistance control signal is in a preset active state, controlling the crystal to form an oscillation loop with the phase-locked loop through the negative resistance circuit.

In the control method as described above, further including:

if the injection control signal is in a preset active state, obtaining a first count control signal, and controlling the digital counter to start a counting operation according to the first count control signal; or if the injection control signal is in a preset inactive state, obtaining a second count control signal, and controlling the digital counter to stop a counting operation according to the second count control signal.

In the control method as described above, further including:

if the negative resistance control signal is in a preset active state, obtaining a first detection control signal and a first filter control signal, controlling the phase frequency detecting circuit to start operating according to the first detection control signal, and controlling the filter circuit to start operating according to the first filter control signal; or if the negative resistance control signal is in a preset inactive state, obtaining a second detection control signal and a second filter control signal, controlling the phase frequency detecting circuit to stop operating according to the second detection control signal, and controlling the filter circuit to stop operating according to the second filter control signal.

A third aspect of the present disclosure is intended to provide a computer readable storage medium having stored thereon a program instruction, where the program instruction is configured to implement the control method of the quick-start clock system described in the second aspect.

The computer readable storage medium, the quick-start clock system and the control method thereof according to the present disclosure effectively solve the problem in the prior art that injection efficiency is not high and varies severely in a PVT due to a big deviation between a resonant frequency of a frequency injecting oscillator with fast oscillation and that of a crystal, besides, additionally solve the problem that a frequency injecting implementation requires more costs, specifically, by means of multiplexing the programmable voltage-controlled oscillator in the phase-locked loop, using a frequency divided clock whose frequency coarsely tuned whereby as an input source, and setting up the number of injecting times according to coarse tuning accuracy of the added digital subsidiary circuit, injection efficiency of the crystal is improved, and the crystal can be started up quickly without increasing costs, ultimately the speed for oscillation of the whole clock system is improved, and stability and reliability of the method are further guaranteed, which is conducive to promotion and application in the market.

| | | | |
|---|---|---|---|
| 100 | crystal oscillator circuit | 101 | crystal |
| 102 | oscillation injecting circuit | 103 | negative resistance circuit |
| 200 | digital subsidiary circuit | 201 | digital memory |
| 202 | digital counter | 300 | phase-locked loop |
| 301 | programmable voltage-controlled oscillator circuit | | |
| 302 | frequency dividing circuit | | |
| 303 | reference voltage circuit | 304 | switch |
| 305 | phase frequency detecting circuit | 306 | filter circuit |

DESCRIPTION OF EMBODIMENTS

In order to make objectives, technical solutions and advantages of the embodiments of the present disclosure clearer, the technical solutions in the embodiments of the present disclosure will be described hereinafter clearly and comprehensively with reference to the accompanying drawings in the embodiments of the present disclosure. Apparently, the described embodiments are part rather than all of the embodiments of the present disclosure. Based on the embodiments of the present disclosure, all the other embodiments obtained by those of ordinary skill in the art without creative work are within the protection scope of the present disclosure.

In the present disclosure, the terms "installation", "connection", "fixation" and the like are to be construed broadly. For example, the "connection" may be a fixed connection, a detachable connection, or an integral connection. For those of ordinary skill in the art, specific meanings of the above terms in the present disclosure can be understood on a case-by-case basis.

It should be noted that in the description of the present disclosure, the terms "first" and "second" are used merely for convenience in describing different components, but are not to be construed as indicating or implying a sequence relationship, relative importance, or implicitly indicating the number of technical features indicated. Thus, features defined with "first" and "second" may explicitly or implicitly include at least one of the features.

Unless otherwise defined, all technical and scientific terms used herein have meanings the same as those commonly understood by persons of ordinary skill in the art to which the present disclosure belongs. The terms used in the description of the present disclosure are merely for the purpose of describing specific embodiments, but are not intended to limit the present disclosure.

Some embodiments of the present disclosure are described in detail below with reference to the accompanying drawings. In the case where there is no conflict between the embodiments, the following described embodiments and the features in the embodiments may be combined with each other.

Figure 1:
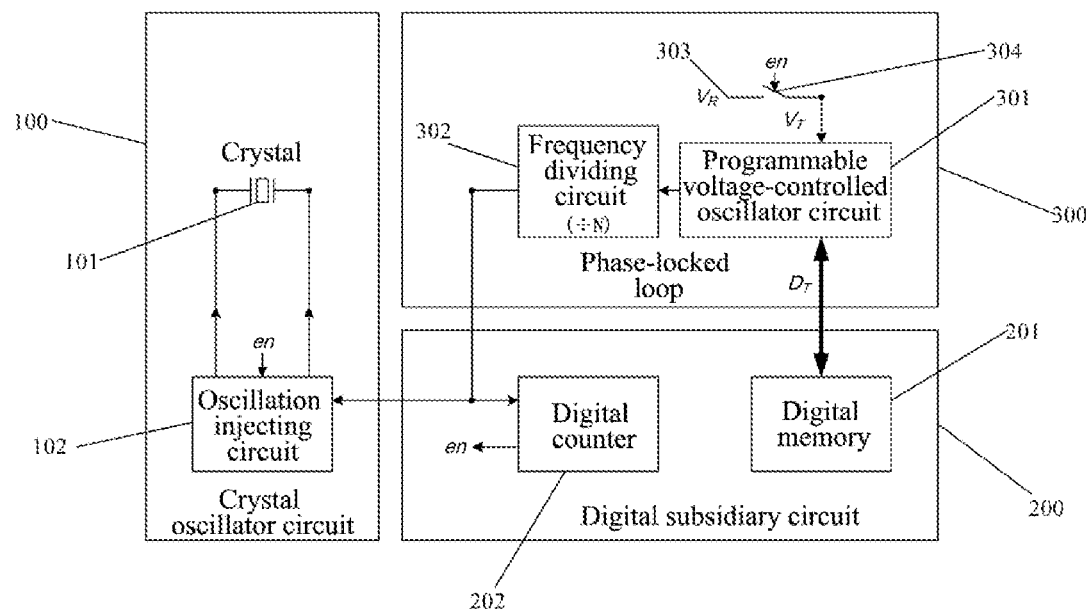
FIG. 1 is a first schematic structural diagram of a quick-start clock system according to an embodiment of the present disclosure.

FIG. 1 is a first schematic structural diagram of a quick-start clock system according to an embodiment of the present disclosure. As shown in FIG. 1, the present embodiment provides a quick-start clock system, which may effectively solve shortcomings in the prior art during injection with a relaxation oscillator, and which is applicable to: a clock system utilizing a crystal oscillator circuit 100 or including the crystal oscillator circuit 100 and a phase-locked loop 300, and a scenario where a very fast stabilized speed is required for the entire clock. Specifically, the system may include: the crystal oscillator circuit 100, a digital subsidiary circuit 200 connected to the crystal oscillator circuit 100 and the phase-locked loop 300 connected to the digital subsidiary circuit 200; where the crystal oscillator circuit 100 includes a crystal which is configured to generate an oscillation frequency; the phase-locked loop 300 is configured to generate a clock signal which can be injected into the crystal oscillator circuit 100, so as to inject energy into the crystal in the crystal oscillator circuit 100, and thus the speed for oscillation of the whole system may be accelerated; the digital subsidiary circuit 200 is configured to count the number of times for which the clock signal is injected into the crystal oscillator circuit 100, and can control the clock signal injection operation of the phase-locked loop 300 according to the number of times counted for the clock signal.

Specifically, the digital subsidiary circuit 200 is configured to output a digital control value.

The phase-locked loop 300 includes: a programmable voltage-controlled oscillator circuit 301 and a frequency dividing circuit 302, the programmable voltage-controlled oscillator circuit 301 and the frequency dividing circuit 302 are connected to the digital subsidiary circuit 200, and the frequency dividing circuit 302 is connected to the programmable voltage-controlled oscillator circuit 301; where the programmable voltage-controlled oscillator circuit 301 is configured to obtain the digital control value output by the digital subsidiary circuit 200, and output a clock signal according to the digital control value, the frequency dividing circuit 302 is configured to perform a frequency dividing operation on the clock signal output by the programmable voltage-controlled oscillator circuit 301; and the crystal oscillator circuit 100 is connected to the phase-locked loop 300, which includes: a crystal 101 and an oscillation injecting circuit 102 connected to the crystal 101, the oscillation injecting circuit 102 is configured to convert the clock signal performed with the frequency dividing operation to a co-frequency fully differential signal, and inject the co-frequency fully differential signal into the crystal 101.

The programmable voltage-controlled oscillator circuit 301 included in the phase-locked loop 300 may output a clock signal which may be used as a reference clock signal of the phase-locked loop 300, after the reference clock signal is subjected to the frequency dividing operation by the frequency dividing circuit 302, a frequency divided clock signal whose frequency has been coarsely tuned can be obtained, the frequency divided clock signal can be used as an input source clock signal of the crystal oscillator circuit 100.

Additionally, a voltage control terminal of the programmable voltage-controlled oscillator circuit 301 is connected with a reference voltage circuit 303. Furthermore, the reference voltage circuit 303 may include a switch 304 which is configured to perform a connection or disconnection operation according to a voltage control signal received, so as to control whether the voltage control terminal of the programmable voltage-controlled oscillator circuit 301 can be connected to a reference voltage. For example, when the switch 304 is switched off, the programmable voltage-controlled oscillator circuit 301 is disconnected from the reference voltage circuit 303, in which case the programmable voltage-controlled oscillator circuit 301 cannot be connected to the reference voltage; when the switch 304 is switched on, the programmable voltage-controlled oscillator circuit 301 is connected to the reference voltage circuit 303, in which case the programmable voltage-controlled oscillator circuit 301 is connected to the reference voltage VR.

Additionally, the oscillation injecting circuit 102 is configured with an injection control terminal which is configured to control the connection or disconnection between the oscillation injecting circuit 102 and the crystal 101 according to an injection control signal received. For example, when the injection control signal is in an active state, the oscillation injecting circuit 102 is connected to the crystal 101, in which case the oscillation injecting circuit 102 can inject a signal into the crystal 101; when the injection control signal is in an inactive state, the oscillation injecting circuit 102 is disconnected from the crystal 101, in which case the oscillation injecting circuit 102 cannot inject a signal into the crystal 101.

Its working principle is: the programmable voltage-controlled oscillator circuit 301 can obtain a digital control value from the digital subsidiary circuit 200, the value may be a preset digital value, or may be a digital value in an historical operation; the programmable voltage-controlled oscillator circuit 301 can output a corresponding clock signal according to the digital control value, after the clock signal is subjected to the frequency dividing operation by the frequency dividing circuit 302, a first clock signal is obtained, and the first clock signal can be input into the oscillation injecting circuit 102 and the digital subsidiary circuit 200, where the oscillation injecting circuit 102 can convert the input first clock signal into a co-frequency fully differential signal (a second clock signal), and inject the co-frequency fully differential signal into the crystal 101, thus injecting energy into the crystal 101.

The quick-start clock system according to the embodiment effectively solves the problem in the prior art that, injection efficiency is not high and varies severely in a PVT due to a big deviation between a resonant frequency of a frequency injecting oscillator with fast oscillation and that of the crystal 101, besides, additionally solve the problem that a frequency injecting implementation requires more costs, specifically, by means of multiplexing the programmable voltage-controlled oscillator in the phase-locked loop 300, and using a frequency divided clock whose frequency coarsely tuned whereby as an input source clock signal, injection efficiency of the crystal 101 is improved, and the crystal 101 can be started up quickly without increasing costs, ultimately the speed for oscillation of the whole clock system is improved, and stability and reliability of the method are further guaranteed, which is conducive to promotion and application in the market.

Based on the above embodiment, with a continued reference to FIG. 1, the digital subsidiary circuit 200 in the present embodiment may include: a digital memory 201 which is connected to a digital control terminal of the programmable voltage-controlled oscillator circuit 301, the digital control terminal is configured to, when the phase-locked loop 300 is operating, automatically search a frequency band control word corresponding to a voltage and frequency of the programmable voltage-controlled oscillator circuit 301, the frequency and voltage of the clock signal output by the programmable voltage-controlled oscillator circuit 301 may be adjusted according to the frequency band control word.

The digital memory 201 may be configured to store a digital control value. The digital control value may be preset by a user, or may be an optimal control value stored by the system in a historical operation state; the programmable voltage-controlled oscillator circuit 301 can read a corresponding digital control value from the digital memory 201.

Additionally, the digital subsidiary circuit 200 may further include a digital counter 202 connected to the frequency dividing circuit 302, and the digital counter 202 is configured to count the number of injection cycles of the injection of co-frequency fully differential signal into the crystal 101. The digital counter 202 is configured with a count terminal which is configured to control, according to a count control signal received, the digital counter 202 to perform or stop a counting operation; for example, when the count control signal is a starting signal, then the digital counter 202 starts a counting operation; if the count control signal is a stopping signal, then the digital counter 202 stops a counting operation. The count control signal may be an enabling signal input or set by a user, which is configured to control the counter to start/stop counting.

By setting the digital subsidiary circuit 200 to include the digital memory 201 and the digital counter 202, the programmable voltage-controlled oscillator circuit 301 may directly obtain a corresponding digital control value from the digital memory 201, such that quality and efficiency of obtaining the digital control value are effectively improved; additionally, a maximum number of injection times may be set through the digital counter 202 and clock accuracy of an injecting clock source (namely, the frequency dividing circuit 302), such that an adjustment to the injection times is realized for the crystal based on the use of the clock signal whose frequency has been coarsely tuned by the frequency dividing circuit 302 as an input source clock signal, in combination with the digital counter 202 in the digital subsidiary circuit 200, moreover, effective control of an injecting operation is further improved for the crystal 101, and stability and reliability of use of the system are guaranteed.

Figure 2:
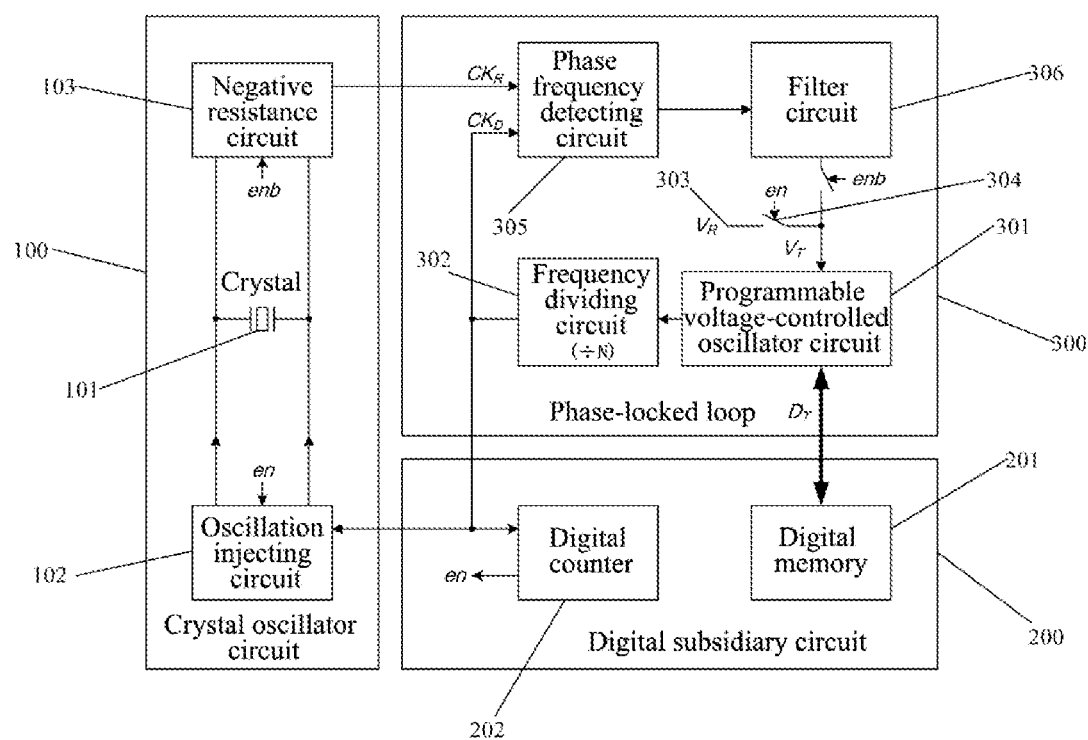
FIG. 2 is a second schematic structural diagram of a quick-start clock system according to an embodiment of the present disclosure.

FIG. 2 is a second schematic structural diagram of a quick-start clock system according to an embodiment of the present disclosure. Based on the above embodiments, with a continued reference to FIG. 2, in order to improve the convenience for utilizing the system, the crystal oscillator circuit 100 in the present embodiment further includes: a negative resistance circuit 103 which is connected to the crystal 101.

The phase-locked loop 300 may further include: a filter circuit 306 and a phase frequency detecting circuit 305 connected to the negative resistance circuit 103, the phase frequency detecting circuit 305 is connected to the filter circuit 306 and the oscillation injecting circuit 102.

The negative resistance circuit 103 is configured with a negative resistance control terminal which is configured to control a connection or disconnection between the negative resistance circuit 103 and the crystal 101 according to a negative resistance control signal enb received. For example, when the negative resistance control signal is in an active state, the negative resistance circuit 103 and the crystal 101 are in a connected state; when the negative resistance control signal is in an inactive state, the negative resistance circuit 103 and the crystal 101 are in a disconnected state.

And the phase frequency detecting circuit 305 and the filter circuit 306 are respectively provided with a detection control terminal and a filter control terminal, the detection control terminal is configure to control a connection or disconnection between the phase frequency detecting circuit 305 and a further circuit or module according to a detection control signal enb received, the filter control terminal is configure to control a connection or disconnection between the filter circuit 306 and a further circuit or module according to a filter control signal enb received; for example, when the detection control signal enb is in an active state, the phase frequency detecting circuit 305 and the negative resistance circuit 103 are in a connected state; when the detection control signal enb is in an inactive state, the phase frequency detecting circuit 305 and the negative resistance circuit 103 are in a disconnected state; when the filter control signal enb is in an active state, the filter circuit 306 and the phase frequency detecting circuit 305 are in a connected state; when the filter control signal enb is in an inactive state, the filter circuit 306 and the phase frequency detecting circuit 305 are in a disconnected state.

In a specific application, the embodiment of the present application may provide a quick-start clock system with high accuracy. As shown in FIG. 2, the system consists of three main parts: a crystal oscillator, the phase-locked loop 300 and the digital subsidiary circuit 200. Additionally, the system may include two operation modes: a quick-start mode and a normal operation mode, a switch therebetween is achieved by a control signal. Specifically, the control signal includes the injection control signal en and the negative resistance control signal enb.

With respect to the system, it enters the quick-start mode first, in which case the injection control signal en=1 (a preset active state), and the negative resistance control signal enb=0 (a preset inactive state). Additionally, control terminals in the system under control of the en (including the injection control terminal of the oscillation injecting circuit 102, the count control terminal of the digital counter 202, the voltage control terminal of the programmable voltage-controlled oscillator circuit 301, and the like) are switched on, and control terminals under control of the enb (including the negative resistance control terminal of the negative resistance circuit 103, the detection control terminal of the phase frequency detecting circuit 305, the filter control terminal of the filter circuit 306, and the like) are switched off, thus, the negative resistance circuit 103, the phase frequency detecting circuit 305 and the filter circuit 306 are turned off, the programmable voltage-controlled oscillator circuit 301 will read a digital control value from the digital memory 201, the value may be an optimal digital control value obtained in a previous normal operation mode.

Figure 3:
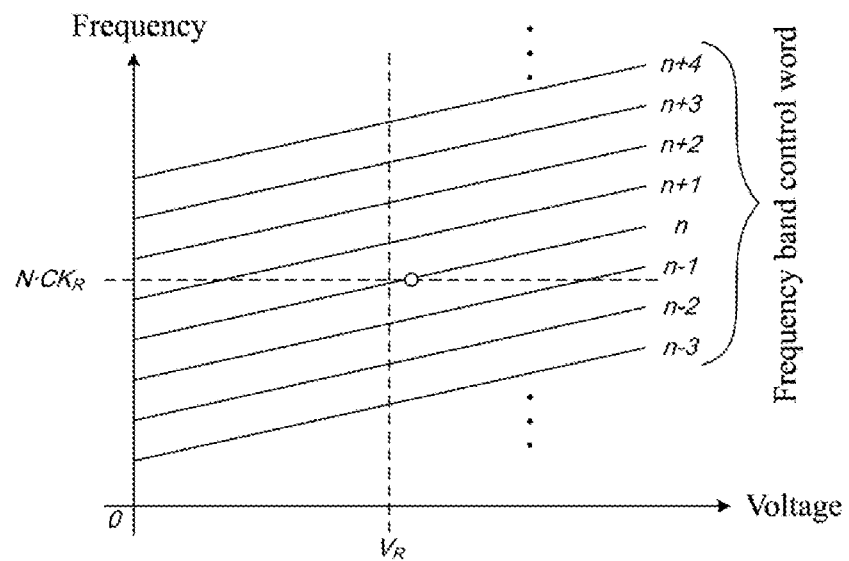
FIG. 3 is a schematic diagram illustrating voltage-control word-frequency characteristics of a programmable voltage-controlled oscillator circuit according to an embodiment of the present disclosure.

The digital control terminal of the programmable voltage-controlled oscillator circuit 301 acts as a coarse tuning terminal of the oscillator, and the oscillation frequency can be controlled below an offset of 5% by means of adjusting the digital control terminal. Specifically, when the phase-locked loop 300 starts operating, the programmable voltage-controlled oscillator circuit 301 can automatically find a set of frequency band control words most approximate to frequency multiplication of a reference frequency by using a preset binary search algorithm, where the frequency band control words are related to the voltage and frequency of the programmable voltage-controlled oscillator circuit 301, reference may be made to FIG. 3 for details; after a frequency band control word is searched, the programmable voltage-controlled oscillator circuit 301 generates a corresponding clock signal based on the frequency band control word and a reference voltage which is input in. Further, the determined frequency band control word may be stored by the digital memory 201 for use in a next quick-start.

Additionally, the voltage control terminal of the programmable voltage-controlled oscillator circuit 301 may be connected to a reference voltage $V_R$, the programmable voltage-controlled oscillator circuit 301 can output a clock signal based on the reference voltage. After being subjected to the frequency dividing operation by the frequency dividing circuit 302, the clock signal is input into the oscillation injecting circuit 102 and the digital counter 202, where the oscillation injecting circuit 102 converts the input clock signal into a co-frequency fully differential signal for output and injects it into the crystal 101, and the digital counter 202 counts the number of injection cycles according to the frequency divided clock signal received. It should be noted that, the specific structure of the oscillation injecting circuit 102 is not limited in the present embodiment, which may be set at the discretion of those of ordinary skill in the art according to functions implemented whereby, on the condition that the input clock signal can be converted to a co-frequency fully differential signal for output and is injected into the crystal 101, and details will not be elaborated herein.

Additionally, the digital counter 202 may set a maximum number of injection times according to clock accuracy of a frequency divided clock signal received. When the digital counter 202 reaches a certain value, the control signals en and enb in FIG. 2 are flipped, the oscillation injecting circuit 102 is turn off and the negative resistance circuit 103 is turned on. Specifically, the oscillation injecting circuit 102 and the digital counter 202 are turned off, the negative resistance circuit 103, the phase frequency detecting circuit 305 and the filter circuit 306 are turned on, such that the crystal oscillator circuit 100 is subjected to a normal oscillation, and provide as a reference clock to the phase-locked loop 300, then the system enters the normal operation mode, such that a switch between the quick-start mode and the normal operation mode is achieved.

After the system enters the normal operation mode, the injection control signal en=0 (a preset inactive state) and the negative resistance control signal enb=1 (a preset active state), in which case only the negative resistance circuit 103 is operating in the crystal oscillator circuit 100 and the oscillation injecting circuit 102 is turned off; the phase-locked loop 300 forms a closed loop, where the digital control terminal of the programmable voltage-controlled oscillator circuit 301 is provided by the digital memory 201 in the digital subsidiary circuit 200. This mode is a common operating scenario with the crystal oscillator circuit 100 plus the phase-locked loop 300, which will not be elaborated herein.

It should be noted that, in the quick-start mode, the negative resistance circuit 103, the phase frequency detecting circuit 305 and the filter circuit 306 are turned off, the programmable voltage-controlled oscillator circuit 301 may be connected to a reference voltage $V_R$, in which case the programmable voltage-controlled oscillator circuit 301 can output a third clock signal based on the reference voltage, the frequency of the third clock signal is approximate to frequency multiplication of a crystal oscillator frequency; while in the normal operation mode, the negative resistance circuit 103, the phase frequency detecting circuit 305 and the filter circuit 306 are turned on, the programmable voltage-controlled oscillator circuit 301 may be connected to a signal of the filter circuit 306, and output a fourth clock signal based on the signal of the filter circuit 306, the frequency of the fourth clock signal is accurate frequency multiplication of the crystal oscillator frequency. In a specific application, the fourth clock signal may be generated by means of the normal operation mode firstly, such that an actual control word of the programmable voltage-controlled oscillator circuit 301 may be found according to the fourth clock signal. Afterwards, obtain the third clock signal by switching to the quick-start mode, and directly output a clock signal whose voltage generating frequency is approximate to the frequency of the third clock signal, thus, stability and reliability of the whole clock system is guaranteed.

Figure 4:
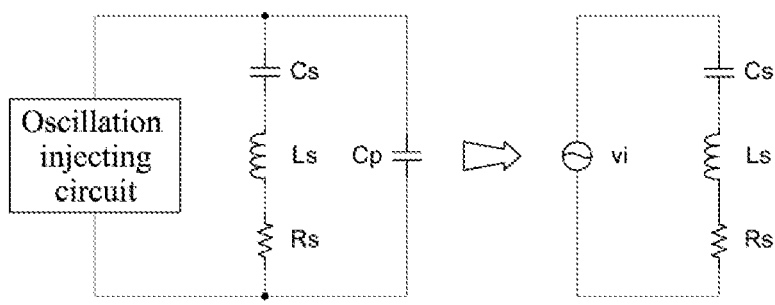
FIG. 4 is a schematic diagram illustrating an equivalent circuit of a crystal oscillator circuit in a quick-start mode according to an embodiment of the present disclosure.

Furthermore, FIG. 4 shows a schematic diagram of an equivalent circuit of the crystal oscillator circuit in the quick-start mode, the left part of which is a schematic structural diagram of the crystal oscillator circuit 100, and the right part of which is the schematic diagram of the equivalent circuit of the crystal oscillator circuit 100. It may be obtained from the circuit diagram that the electric current flowing through the inductor is:

$$I(s) = \frac{V_i \omega_i}{s^2 + \omega_i^2} \cdot \frac{1}{sL + \frac{1}{sC} + R}$$

where s is the digital control value of the programmable voltage-controlled oscillator circuit 301.

Presuming that the resonance frequency of the LC in the crystal 101 is $\omega_s$, then a quality factor Q is defined as:

$$Q = \frac{\omega_s L}{R} = \frac{1}{\omega_s CR}$$

Then, the inductor current can be simplified as:

$$I(s) = \frac{V_i}{L} \frac{\omega_i}{s^2 + \omega_i^2} \frac{s}{s^2 + \frac{\omega_s}{Q} + \omega_s^2}$$

Through an inverse Laplace transform to the above equation, the inductor current in time domain can be obtained as:

$$i_s(t) = \frac{V_i}{L} \frac{1}{Q(\omega_s^2 - \omega_i^2)^2 + \omega_s^2 \omega_i^2} \left\{ \omega_i \left[ \omega_s \omega_i \sin(\omega_i t) + \frac{\omega_s^2 + \omega_i^2}{2} \sin(\omega_s t) e^{-\frac{\omega_s t}{2Q}} \right] - \omega_i(\omega_s^2 - \omega_i^2) Q \left[ \cos(\omega_s t) e^{-\frac{\omega_s t}{2Q}} - \cos(\omega_i t) \right] \right\}$$

Since the crystal 101 has a very large Q value, which commonly amounts to a magnitude of 1-100,000, thus presuming that Q amounts to infinite, then the above equation is transformed to:

$$i_{s,Q\to\infty}(t) = -\frac{V_i}{L} \frac{\omega_i}{(\omega_s^2 - \omega_i^2)} [\cos(\omega_0 t) - \cos(\omega_i t)] \approx \frac{V_i}{L} \frac{2\omega_i}{(\omega_s^2 - \omega_i^2)} \sin(\omega_s t) \sin\left(\frac{\omega_s - \omega_i}{2} t\right)$$

Figure 5:
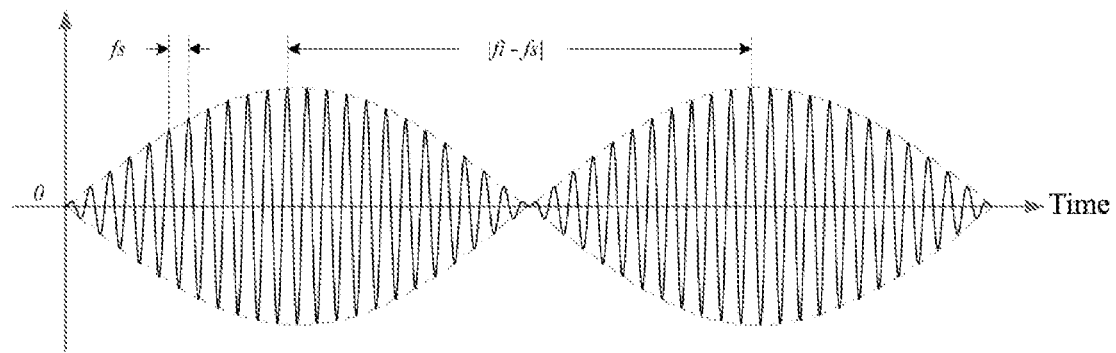
FIG. 5 is a schematic diagram illustrating a waveform of an inductor current when a Q value of a crystal is extremely large according to an embodiment of the present disclosure.

The waveform of the equation is shown in FIG. 5, it can be seen that because of the offset between the injection frequency fi and the resonant frequency fs, a modulation frequency occurs, thus a stagnation point arises in every gap of frequency difference |fs−fi|, which neutralizes all the energy injected beforehand. Therefore, the number of injection cycles set by the digital counter 202 should not exceed a half cycle of the frequency difference, namely:

$$n \leq \frac{f_s}{2|f_s - f_i|}$$

Figure 6:
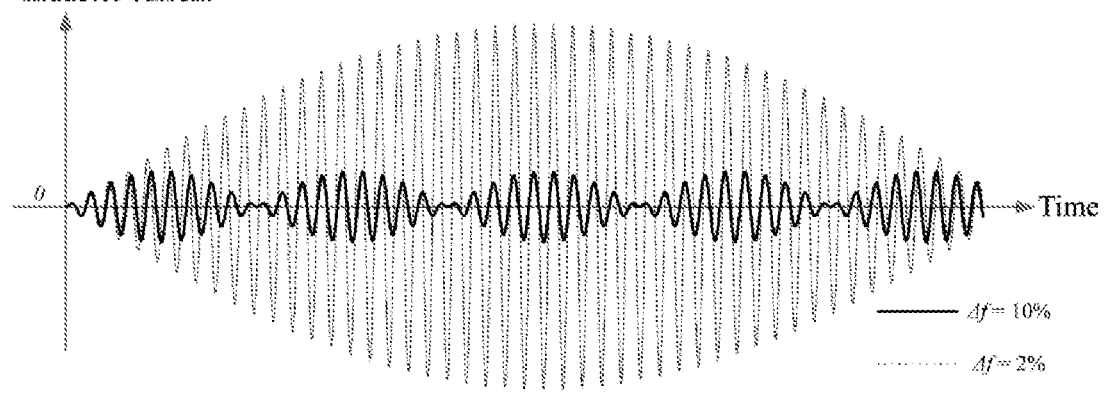
FIG. 6 is a schematic diagram illustrating a waveform of an inductor current under different injection frequency offsets.

The waveform of the inductor current under different frequency differences is shown in FIG. 6, where the solid line represents a schematic diagram illustrating a change in the inductor current over time when the frequency difference Δf=10%, and the dotted line represents a schematic diagram illustrating a change in the inductor current over time when the frequency difference Δf=2%. It can be seen that the smaller the frequency difference (i.e. |fs−fi|) is, the greater the extremum of the current envelope, namely, the greater the injected energy is, the time for oscillation stabilization of the crystal oscillator circuit 100 is shorter after an entry into the normal operation mode from the quick-start mode. When the frequency difference is almost 0, the equation of the inductor current may be simplified as below:

$$i_{s,\omega_i\to\omega_s} = \frac{V_i}{R} \sin(\omega_s t) \left(1 + e^{-\frac{\omega_s t}{2Q}}\right)$$

It can be seen that the energy injected into the crystal 101 exponentially rises over time when the injection frequency is very close to the resonant frequency, thus, the aim can be achieved by means of improving the coarse tuning accuracy of the programmable voltage-controlled oscillator circuit 301.

By means of multiplexing the programmable voltage-controlled oscillator in the phase-locked loop 300, using the frequency divided clock whose frequency has been coarsely tuned by the frequency dividing circuit 302 as an input source, and then setting the number of injection times according to the known coarse tuning accuracy, the efficiency of frequency injection is improved without increasing costs, and the crystal 101 can be started very fast, and the practicability of the system is improved effectively, which is conducive to promotion and application in the market.

Figure 7:
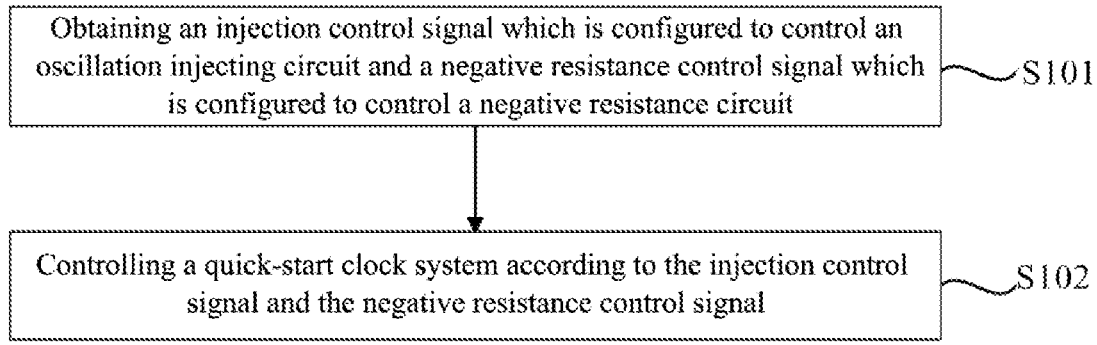
FIG. 7 is schematic flowchart of a control method based on a quick-start clock system according to an embodiment of the present disclosure.

FIG. 7 is schematic flowchart of a control method based on a quick-start clock system according to an embodiment of the present disclosure. As shown in FIG. 7, a control method based on a quick-start clock system is provided in the present embodiment, where the specific structure of the quick-start clock system is shown in FIG. 2, based on the above quick-start clock system, the control method includes:

S101: obtaining an injection control signal which is configured to control an oscillation injecting circuit and a negative resistance control signal which is configured to control a negative resistance circuit.

S102: controlling the quick-start clock system according to the injection control signal and the negative resistance control signal.

Specifically, the controlling the quick-start clock system according to the injection control signal and the negative resistance control signal may include:

S1021: if the injection control signal is in a preset active state, and the negative resistance control signal is in a preset inactive state, controlling the oscillation injecting circuit to inject a co-frequency fully differential signal into the crystal.

At this time, the system is in a quick-start mode, namely, the negative resistance circuit, the phase frequency detecting circuit and the filter circuit are turned off, the programmable voltage-controlled oscillator circuit will read a digital control value from the digital memory, the value may be an optimal digital control value obtained in a previous normal operation mode. Additionally, the voltage control terminal of the programmable voltage-controlled oscillator circuit may be connected to a reference voltage VR, and output a clock signal. After being subjected to the frequency dividing operation by the frequency dividing circuit, the clock signal is input into the oscillation injecting circuit and the digital counter, where the oscillation injecting circuit converts the input clock into a co-frequency fully differential signal for output and injects it into the crystal, and the digital counter counts the number of injection cycles. At this time, the digital counter may set a maximum number of injection times according to clock accuracy of an injecting clock source, after the digital counter reaches a certain value, the control signals en and enb in the system in FIG. 2 are flipped, the oscillation injecting circuit is turned off and the negative resistance circuit is turned on. Specifically, the oscillation injecting circuit and the digital counter are turned off, the negative resistance circuit, the phase frequency detecting circuit and the filter circuit are turned on, such that the crystal oscillator circuit is subjected to a normal oscillation, and provide as a reference clock to the phase-locked loop, then the system enters the normal operation mode, such that a switch between the quick-start mode and the normal operation mode is implemented.

S1022: if the injection control signal is in a preset inactive state, and the negative resistance control signal is in a preset active state, controlling the crystal to form an oscillation loop with the phase-locked loop through the negative resistance circuit.

At this time, the system is in the normal operation mode. Specifically, only the negative resistance circuit is operating in the crystal oscillator circuit and the oscillation injecting circuit is turned off; the phase-locked loop forms a closed loop, where the digital control terminal of the programmable voltage-controlled oscillator circuit is provided by the digital memory in the digital subsidiary circuit.

It should be noted that the method in the present embodiment further includes:

S201: if the injection control signal is in a preset active state, and a count control signal which is configure to control the digital counter is in an active state as well, obtaining a first count control signal which is configured to control the digital counter, and controlling the digital counter to start a counting operation according to the first count control signal.

S202: if the injection control signal is in a preset inactive state, and a count control signal which is configure to control the digital counter is in an inactive state as well, then obtaining a second count control signal, and controlling the digital counter to stop a counting operation according to the second count control signal.

Furthermore, the method may further include:

S301: if the negative resistance control signal is in a preset active state, and a detection control signal which is configured to control the phase frequency detecting circuit and a filter control signal which is configured to control the filter circuit are both in an active state, obtaining a first detection control signal and a first filter control signal, controlling the phase frequency detecting circuit to start operating according to the first detection control signal, and controlling the filter circuit to start operating according to the first filter control signal.

S302: if the negative resistance control signal is in a preset inactive state, and a detection control signal which is configured to control the phase frequency detecting circuit and a filter control signal which is configured to control the filter circuit are both in an inactive state, obtaining a second detection control signal and a second filter control signal, controlling the phase frequency detecting circuit to stop operating according to the second detection control signal, and controlling the filter circuit to stop operating according to the second filter control signal.

Implementation processes and beneficial effects of the control method of the quick-start clock system provided in the present embodiment are the same as the working principles and beneficial effects of the quick-start clock system corresponding to the foregoing embodiments of FIG. 1-FIG. 6, which may be specifically referred to the content in the foregoing description, and will not be elaborated herein.

Another aspect of the embodiments of the present disclosure provides a computer readable storage medium having stored thereon a program instruction, where the program instruction is used for the foregoing control method of the quick-start clock system.

The technical solutions and technical features in the above various embodiments may be used separately or in combination if not conflicting with each other, these cases are considered to be equivalent embodiments within the protection scope of the present application as long as they do not exceed the perception of those skilled in the art.

In the several embodiments provided in the present disclosure, it should be understood that the related device and method disclosed may be implemented in other manners. For example, the device embodiments described above are merely illustrative. For example, the partition of the module or unit is only a logical function partition. There may be other manners for partition in an actual implementation, for example, multiple units or components may be combined with or integrated into another system, or some features may be omitted or not executed. In addition, the mutual coupling or direct coupling or communication connection shown or discussed may be implemented through some interfaces, an indirect coupling or communication connection between devices or units may be electrical, mechanical or otherwise.

The units described as discrete components may or may not be physically separated, a component shown as a unit may or may not be a physical unit, namely, it may be located in one place, or may be distributed in multiple network elements. Some or all of the units may be selected according to actual needs to achieve the purpose of the solution of the embodiments.

The integrated units may be stored in a computer readable storage medium if being implemented in the form of a software functional unit and sold or used as a standalone product. Based on such understanding, the technical solutions of the present disclosure, substantively, or a part of which that makes a contribution to the prior art, or the whole or a part of which, may be embodied in the form of a software product which is stored in a storage medium, where a plurality of instructions are included to cause a computer processor to execute all or part of the steps of the methods described in the various embodiments of the present disclosure. The foregoing storage medium includes: a USB flash disk, a mobile hard disk drive, a read-only memory (ROM), a random access memory (RAM), a magnetic disk or an optical disk, or other medium that can store program codes.

The foregoing description is simply embodiments of the present disclosure, and is not intended to limit the scope of the present disclosure. An alteration for an equivalent structure or equivalent process made based on the specification and the drawings of the present disclosure, or a direct or indirect application to other related technical fields, shall all be included in the protection scope of the present disclosure for the same reason.

Finally, it should be noted that the above embodiments are only used to explain the technical solutions of the present disclosure but are not intended to limit the present disclosure; although the present disclosure has been described in detail with reference to the foregoing embodiments, those of ordinary skill in the art should understand that modifications can be made to the technical solutions recorded in the embodiments, or some or all technical features thereof may be substituted by their equivalents, and such modifications or substitutions do not cause the nature of the corresponding technical solutions to deviate from the scope of the technical solutions of the embodiments of the present disclosure.

What is claimed is:

1. A quick-start clock system, comprising:
a digital subsidiary circuit, configured to output a digital control value;
a phase-locked loop, comprising a programmable voltage-controlled oscillator circuit and a frequency dividing circuit, wherein the programmable voltage-controlled oscillator circuit and the frequency dividing circuit are connected to the digital subsidiary circuit, and the frequency dividing circuit is connected to the programmable voltage-controlled oscillator circuit, the programmable voltage-controlled oscillator circuit is configured to obtain the digital control value output by the digital subsidiary circuit, and output a clock signal according to the digital control value, the frequency dividing circuit is configured to perform a frequency dividing operation on the clock signal output by the programmable voltage- controlled oscillator circuit; and, a crystal oscillator circuit connected to the phase-locked loop, comprising a crystal and an oscillation injecting circuit connected to the crystal, wherein the oscillation injecting circuit is configured to convert the clock signal performed with the frequency dividing operation to a co-frequency fully differential signal, and inject the co-frequency fully differential signal into the crystal.

2. The system according to claim 1, wherein the digital subsidiary circuit comprises a digital memory connected to a digital control terminal of the programmable voltage-controlled oscillator circuit, the digital control terminal is configured to, when the phase-locked loop starts operating, automatically search a frequency band control word corresponding to a voltage and frequency of the programmable voltage-controlled oscillator circuit.

3. The system according to claim 2, wherein the digital subsidiary circuit further comprises a digital counter connected to the frequency dividing circuit, and the digital counter is configured to count a number of injection cycles of the injection of co-frequency fully differential signal into the crystal.

4. The system according to claim 3, wherein the digital counter is configured with a count control terminal, the count control terminal is configured to control, according to a count control signal, the digital counter to perform or stop a counting operation.

5. The system according to claim 1, wherein the crystal oscillator circuit further comprises a negative resistance circuit connected to the crystal;

the phase-locked loop further comprises a filter circuit, and a phase frequency detecting circuit connected to the negative resistance circuit, the phase frequency detecting circuit is connected to the filter circuit and the oscillation injecting circuit.

6. The system according to claim 5, wherein the negative resistance circuit is configured with a negative resistance control terminal, the negative resistance control terminal configured to control a connection or disconnection between the negative resistance circuit and the crystal according to a negative resistance control signal.

7. The system according to claim 5, wherein the phase frequency detecting circuit and the filter circuit are respectively provided with a detection control terminal and a filter control terminal, the detection control terminal is configured to control a connection or disconnection of the phase frequency detecting circuit according to a detection control signal, the filter control terminal is configured to control a connection or disconnection of the filter circuit according to a filter control signal.

8. The system according to claim 1, wherein a voltage control terminal of the programmable voltage-controlled oscillator circuit is connected to a reference voltage circuit, the reference voltage circuit configured to provide a reference voltage signal for controlling the programmable voltage-controlled oscillator circuit to operate.

9. The system according to claim 8, wherein the reference voltage circuit comprises a switch, the switch is configured to perform a connection or disconnection operation according to a voltage control signal.

10. The system according to claim 1, wherein the oscillation injecting circuit is configured with an injection control terminal, the injection control terminal is configured to control a connection or disconnection between the oscillation injecting circuit and the crystal according to an injection control signal.

11. A control method based on the quick-start clock system according to claim 1, comprising:
obtaining an injection control signal for controlling an oscillation injecting circuit of the quick-start clock system, and a negative resistance control signal for controlling a negative resistance circuit of the quick-start clock system; and
controlling the quick-start clock system according to the injection control signal and the negative resistance control signal.

12. The control method according to claim 11, wherein the controlling the quick-start clock system according to the injection control signal and the negative resistance control signal comprises:
when the injection control signal is in a preset active state, and the negative resistance control signal is in a preset inactive state, controlling the oscillation injecting circuit to inject a co-frequency fully differential signal into a crystal of the quick-start clock system; or
when the injection control signal is in a preset inactive state, and the negative resistance control signal is in a preset active state, controlling the crystal to form an oscillation loop with a phase-locked loop of the quick-start clock system through the negative resistance circuit.

13. The control method according to claim 12, further comprising:
when the injection control signal is in a preset active state, obtaining a first count control signal, and controlling a digital counter of the quick-start clock system to start a counting operation according to the first count control signal; or
when the injection control signal is in a preset inactive state, obtaining a second count control signal, and controlling the digital counter to stop a counting operation according to the second count control signal.

14. The control method according to claim 12, further comprising:
when the negative resistance control signal is in a preset active state, obtaining a first detection control signal and a first filter control signal, controlling a phase frequency detecting circuit of the quick-start clock system to start operating according to the first detection control signal, and controlling a filter circuit of the quick-start clock system to start operating according to the first filter control signal; or
when the negative resistance control signal is in a preset inactive state, obtaining a second detection control signal and a second filter control signal, controlling the phase frequency detecting circuit to stop operating according to the second detection control signal, and controlling the filter circuit to stop operating according to the second filter control signal.

15. A computer readable storage medium having stored thereon a program instruction, wherein the program instruction is used to implement the control method according to claim 11.

16. The computer readable storage medium according to claim 15, wherein the controlling the quick-start clock system according to the injection control signal and the negative resistance control signal comprises:
when the injection control signal is in a preset active state, and the negative resistance control signal is in a preset inactive state, controlling the oscillation injecting circuit to inject a co-frequency fully differential signal into a crystal of the quick-start clock system; or when the injection control signal is in a preset inactive state, and the negative resistance control signal is in a preset active state, controlling the crystal to form an oscillation loop with a phase-locked loop of the quick-start clock system through the negative resistance circuit.

17. The computer readable storage medium according to claim 16, wherein the method further comprising:

when the injection control signal is in a preset active state, obtaining a first count control signal, and controlling a digital counter of the quick-start clock system to start a counting operation according to the first count control signal; or when the injection control signal is in a preset inactive state, obtaining a second count control signal, and controlling the digital counter to stop a counting operation according to the second count control signal.

18. The computer readable storage medium according to claim 16, wherein the method further comprising:

when the negative resistance control signal is in a preset active state, obtaining a first detection control signal and a first filter control signal, controlling the a phase frequency detecting circuit of the quick-start clock system to start operating according to the first detection control signal, and controlling a filter circuit of the quick-start clock system to start operating according to the first filter control signal; or when the negative resistance control signal is in a preset inactive state, obtaining a second detection control signal and a second filter control signal, controlling the phase frequency detecting circuit to stop operating according to the second detection control signal, and controlling the filter circuit to stop operating according to the second filter control signal.

* * * * *